United States Patent
Adesida et al.

(10) Patent No.: US 6,586,328 B1
(45) Date of Patent: Jul. 1, 2003

(54) METHOD TO METALLIZE OHMIC ELECTRODES TO P-TYPE GROUP III NITRIDES

(75) Inventors: Ilesanmi Adesida, Champaign, IL (US); Ling Zhou, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 09/586,910

(22) Filed: Jun. 5, 2000

(51) Int. Cl.[7] .......................................... H01L 21/4763
(52) U.S. Cl. ...................... 438/628; 438/46; 438/513; 438/604; 438/796
(58) Field of Search .............................. 438/628, 45, 46, 438/47, 604, 606, 22, 513, 688, 796, 479, 505, 518

(56) References Cited

U.S. PATENT DOCUMENTS

| | | | |
|---|---|---|---|
| 5,708,301 A | | 1/1998 | Iyechika et al. |
| 5,966,629 A | | 10/1999 | Teraguchi |
| 6,143,635 A | * | 11/2000 | Boyd et al. |
| 6,153,935 A | * | 11/2000 | Edelstein et al. ........... 257/773 |
| 6,194,743 B1 | * | 2/2001 | Kondoh et al. ................ 257/94 |
| 6,239,490 B1 | * | 5/2001 | Yamada et al. .............. 438/604 |

OTHER PUBLICATIONS

Suzuki et al. (Applied Physics Letters vol. 74, No. 2, Jan. 11, 1999. pp. 275–276).*
Suzuki et al. Applied Physics letters, vol. 74 No. 2, Jan. 11, 1999 p. 275–276.*
Ho et al.. Applied Physics letters, vol. 74 No., Mar. 1, 1999 p. 1275–1277.*
Adesida et al. (Internal Publication, Dept of ECE, University of Illinois).*
M. Suzuki, T. Kawakami, T. Arai, S. Kobayashi, Y. Koide, T. Uemura, N. Shibata, M. Murakami, "Low–Resistance Ta/Ti Ohmic Contacts for p–type GaN", *Applied Physics Letters*, vol. 74, No. 2, Jan. 11, 1999, pp. 275–276.

J.K. Kim, J.L. Lee, J.W. Lee, H.E. Shin, Y.J. Park, T. Kim, "Low Resistance Pd/Au Ohmic Contacts to p–type GaN Using Surface Treatment", *Applied Physics Letters*, vol. 73, No. 20, Nov. 16, 1998, pp. 2953–2955.

J.K. Ho, C.S. Jong, C.C. Chiu, C.N. Huang, C.Y. Chen, K.K. Shih, "Low–Resistance Ohmic Contacts to p–type GaN", *Applied Physics Letters*, vol. 74, No. 9, Mar. 1, 1999, pp. 1275–1277.

L.S. McCarthy, P. Kozodoy, M.J.W. Rodwell, S.P. DenBaars, U.K. Mishra, "AlGaN/GaN Heterojunction Bipolar Transistor", *IEEE Electron Device Letters*, vol. 20, No. 6, Jun. 1999, p. 277–279.

L. Zhou, W. Lanford, A.T. Ping, I. Adesida, J.W. Yang, A. Khan, "Low Resistance Ti/Pt/Au Ohmic Contacts to p–type GaN", paper submitted to *Applied Physics Letters* for publication on Nov. 29, 1999.

L. Zhou, F. Khan, A.T. Ping, A. Osinski, I. Adesida, "Characteristics of Ti/Pt/Au Ohmic Contacts on p–type GaN/$Al_xGa_{1-x}N$ Superlattices".

(List continued on next page.)

*Primary Examiner*—Matthew Smith
*Assistant Examiner*—Igwe U. Anya
(74) *Attorney, Agent, or Firm*—Greer, Burns & Crain, Ltd.

(57) ABSTRACT

The metallization method of the invention uses an oxide-forming metal layer to improve adhesion and getter surface contamination or oxides. A high work function metal is then formed on the oxide-forming layer. An anneal is conducted to diffuse the high work function on metal through the oxide-forming layer. One or more metal cap layers may top the high work function metal to protect the high work function metal.

8 Claims, 4 Drawing Sheets

OTHER PUBLICATIONS

L. Zhou, A.T. Ping, F. Khan, A. Osinski, I. Adesida, "Ti/Pt/Au Ohmic Contacts on p–type GaN/Al$_x$Ga$_{1-x}$N Superlattices", *Electronics Letters*, vol. 36, No. 1, Jan. 6, 2000.

L. Zhou, A.T. Ping, F. Khan, A. Osinski, I. Adesida, "Ti/Pt/Au Ohmic Contacts on p–type GaN/Al$_x$GA$_{1-x}$N Superlattices" outline.

S.J. Pearton, J.C. Zolper, R.J. Shul, F. Ren, "GaN: Processing, Defects, and Devices", *Journal of Applied Physics*, vol. 86, No. 1, Jul. 1, 1999, pp. 1–78.

B.P. Luther, J.M. DeLucca, S.E. Mohney, R.F. Karlicek, Jr., "Analysis of a Thin AlN Interfacial Layer in Ti/Al and Pd/Al Ohmic Contacts to n–type GaN", *Appl. Phys. Lett.*, vol. 71, No. 26, Dec. 29, 1997, p. 3859–3861.

T. Mori, T. Kozawa, T. Ohwaki, Y. Taga, S. Nagal, S. Yamasaki, S. Asami, N. Shibata, M. Koide, "Schottky Barriers and Contact Resistances on p–type GaN", *Appl. Phys. Lett.*, vol. 69, No. 23, Dec. 2, 1996, p. 3537–3539.

L. Zhou, W. Lanford, A.T. Ping, I. Adesida, J.W. Yang, A. Khan, "Low Resistance Ti/Pt/Au Ohmic Contacts to p–type GaN", *Applied Physics Letters*, vol. 76, No. 23, Jun. 5, 2000, pp. 3451–3453.

Shuji Nakamura, Masayuki Senoh and takashi Nukai, "High Power InGaN/GaN double–heterostructure violet light emitting diodes", Applied Physics Letters, vol. 62, No. 19, May 10, 1993, pp. 2390–2392.

L.L. Smith and R.F. Davis, "Microstructure, electrical properties and thermal stability of Ti–based ohmic contacts on n–GaN", Material research Society, vol. 14, No. 3, Mar. 1999, pp. 1032–1038.

D.J. King, L. Zhang, J.C. Ramer, S.C. Hersee, L.F. Lester, "Temperature Behavior of Pt/Au Ohmic Contacts to PgaN", Mat Res. Soc. Symp Proc. vol. 468, 1997, pp. 421–427.

\* cited by examiner

METHOD TO METALLIZE OHMIC ELECTRODES TO P-TYPE GROUP III NITRIDES

This invention was made with Government support under Grant No. DARPA-DAAD 19-99-1-0011 awarded by the U.S. Army Research Office. The Government has certain rights in the invention.

FIELD OF THE INVENTION

The invention is in the semiconductor fabrication field.

BACKGROUND OF THE INVENTION

An important performance and reliability issue in many types of semiconductor devices is the quality of contacts. The resistivity of the contacts directly impacts speed, power consumption, and the tendency of a device to heat during operation. Metals, such as copper, make good contacts but bond poorly to semiconductors. Contact separation obviously limits device reliability. Accordingly, contacts are typically formed by metallizations in the art. The search for high quality contacts is a continuing effort in the art.

P-type Group III nitride materials form the basis for many important semiconductor devices, including transistors, light emitting diodes and laser diodes. For these devices to be efficient, contacts to the devices must be ohmic and exhibit low contact resistances. Absent extremely low contact resistances, contact electrodes will overheat and impact device lifetime. Overheated p-GaN ohmic contacts due to poor conductivity have been identified as the life limiting factor in nitride laser diodes. See, Nakamura et al., Appl. Phys. Lett. 62, 2930 (1993). Poor p-ohmic contacts have also limited performance in AlGaN/GaN heterojunction bipolar transistors. See, McCarthy et al, IEEE Electron Device Lett. 20, 277 (1999).

These types of problems have limited the development of optoelectronic devices based upon the p-type Group III nitrides. The difficulty in forming contacts to the p-type Group III materials arises from their large bandgaps and low hole concentrations resulting from difficulties in achieving high doping and the large ionization energy required to activate the magnesium acceptors.

Known past efforts have resulted in three ohmic metallization processes on moderately doped p-GaN that have achieved specific contact resistances less than $10^{-4}$ Ω-cm. One method uses Ta/Ti bilayer contacts and requires a post-deposition anneal of 20 minutes at 800° C. to achieve $R_C = 3 \times 10^{-5}$ Ω-cm$^2$ on p-GaN doped at $7 \times 10^{17}$ cm$^{-3}$. The electrodes produced by the method are unstable in air. Another method which achieves contact resistances as low as $4 \times 10^{-6}$ Ω-cm$^2$, requires deliberate oxidation of Ni/Au contacts at 500° C.~600° C. for ten minutes. The oxidation is difficult to control and can result in the oxidation of unintended device areas. Another method forms platinum contacts on carefully cleaned GaN. The cleaning is conducted to remove all oxygen from the GaN surface prior to platinum metallization. Boiling potassium or aqua regia (3:1 mixture of HCl:HNO$_3$) are often used for the cleaning operation. Apart from the inherent volatility and danger of such a process, the base tends to attack photo resist, and acid attacks other metal layers on the device.

Thus, there is a need for an improved metallization method to form ohmic contacts on the p-type Group III nitride material systems. The present invention is directed to this need.

SUMMARY OF THE INVENTION

The metallization method of the invention uses an oxide-forming metal layer to improve adhesion and getter surface contamination or oxides. A high work function metal is then formed on the oxide-forming layer. An anneal is conducted to diffuse the high work function metal through the oxide-forming layer. One or more metal cap layers may top the high work function metal to protect the high work function metal.

In the metallization method for forming a contact electrode on p-type Group III nitride materials, the oxide forming metal layer is deposited on a surface of a p-type Group III layer by, for example, electron beam evaporation. The oxide forming metal layer may comprise titanium, chromium, or palladium. Subsequently, a high work function metal $q\Phi_m > 4.5$ eV is deposited on the oxide forming layer. An anneal is conducted at a temperature sufficient to diffuse the high work function metal through the oxide layer. A nonreactive metal layer may be deposited on the high work function metal as a cap/overlay to protect the contact from oxidation.

BRIEF DESCRIPTION OF THE DRAWINGS

Other features and advantages of the invention will be apparent to those skilled in the art with reference to the detailed description and the drawings, of which.

DETAILED DESCRIPTION OF THE PREFERRED EMBODIMENTS

Metallizations formed by the invention are generally applicable to p-type Group III nitride materials. Experiments have formed particular contacts and verified very low specific and contact resistances, down to lowest $R_C$ of $4.2 \times 10^{-5}$ and $\rho_c$ of 21 Ω-cm on unoxidized p-type GaN. Contacts formed by the invention may comprise different multilayer structures.

Figure 1:
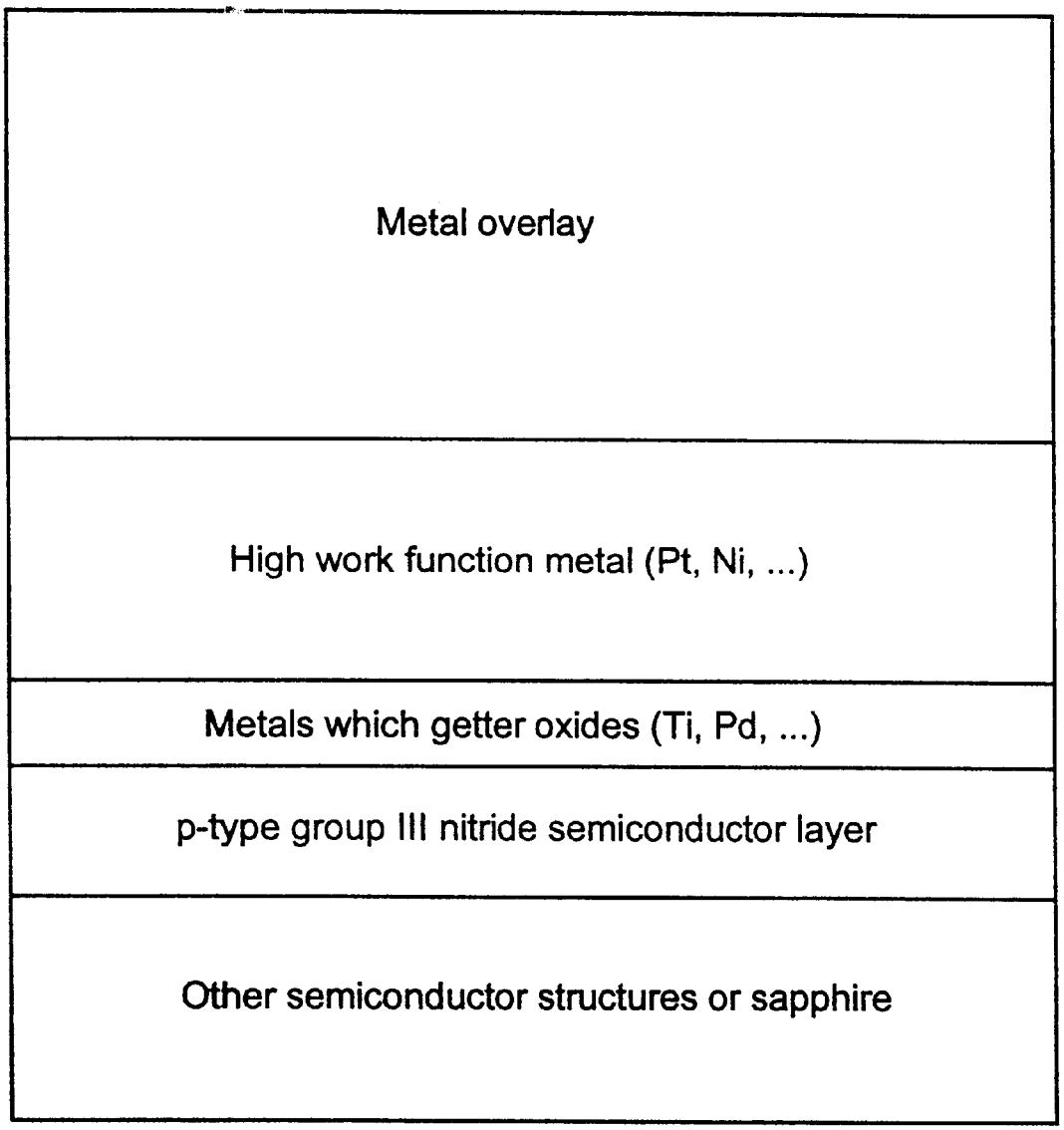
FIG. 1 illustrates layers used to form contacts in accordance with a preferred embodiment of the method of the invention.

A preferred contact metallization formed by the invention is shown in FIG. 1. Such a contact has been realized in experiments conducted to verify the invention. In laboratory experiments, p-type GaN film on which contacts were formed was grown by MOCVD on sapphire substrates. An undoped GaN layer of 3 μm was grown, followed by growth of 0.3 μm thick p-type GaN doped with Mg. A dopant activation anneal was carried out at 800° C. for one minute. A bulk carrier concentration of approximately $2.5 \times 10^{17}$ cm$^{-3}$ and a mobility of 9 cm$^2$V$^{-1}$S$^{-1}$ were obtained from room temperature Hall measurements. Contact resistances were determined using the linear transfer length method (TLM). Active regions used for TLM measurements were defined by reactive ion etching. Rectangular pads were then patterned on these electrically isolated mesas. Prior to metal evaporation, the surfaces were cleaned in O$_2$ plasma, followed by dips in a dilute HCl:H$_2$O (1:2) and blown dry in N$_2$.

A 15 nm surface getter layer of Ti was deposited through electron beam evaporation. The subsequent high work function layer was Pt, specifically, a Pt electron beam evaporation deposit. A 80 nm capping layer was then formed through thermal evaporation. Post-deposition heat treatment was carried out while flowing $N_2$ at 1 atmosphere. I–V and TLM characteristics of contacts thus formed were measured using a four-probe arrangement at room temperature. Measurements were taken both before and after heat treatment. Actual pad spacings were determined by scanning electron microscopy (SEM) after pad fabrication to provide physical dimensions for an accurate $R_C$ determination.

Figure 2:
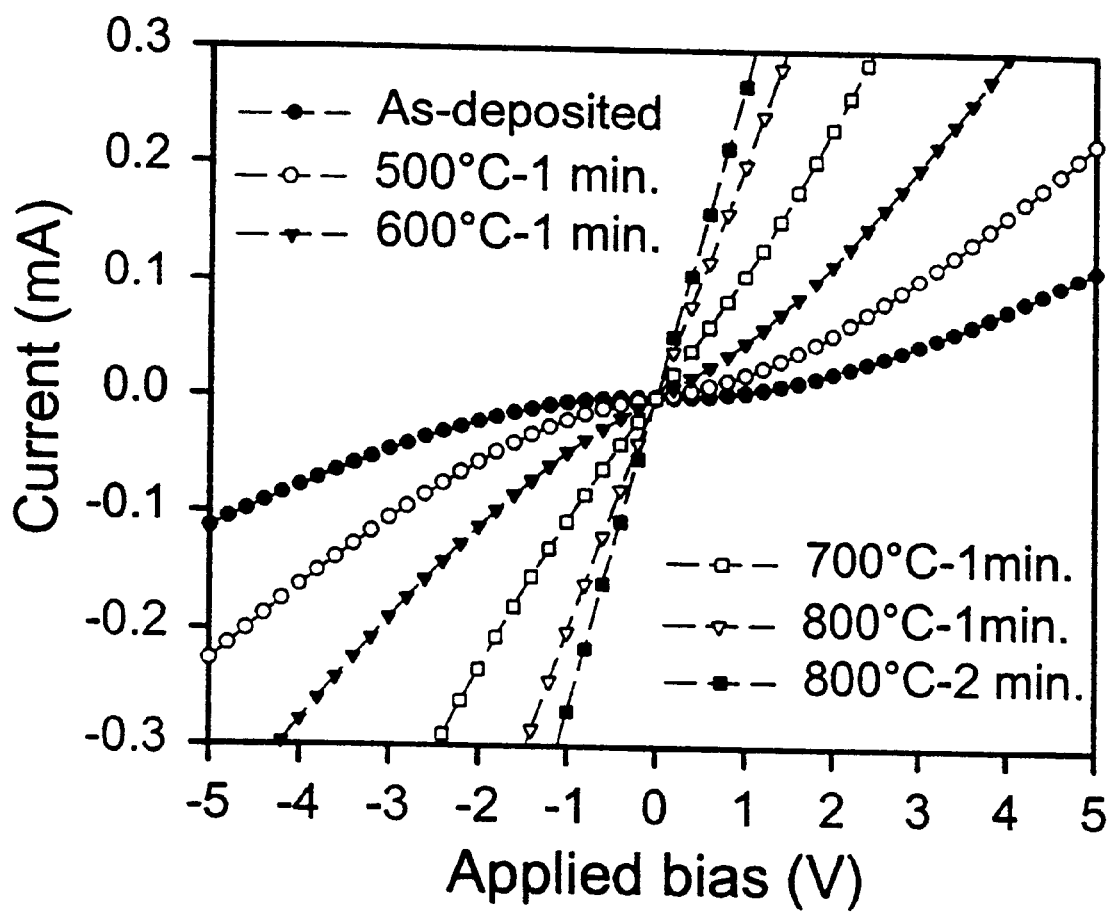
FIG. 2 illustrates I–V characteristics for as-deposited and annealed Ti/Pt/Au contacts formed in accordance with the invention.

FIG. 2 illustrates I–V characteristics of as-deposited and heat treated experimental Ti/Pt/Au contacts, measured between ohmic pads with a spacing of 3 $\mu$m. The contacts are rectifying as deposited, and remained weakly rectifying after annealing at 500° C.–600° C. for one minute. Linearity of the I–V curves improved, however, with higher annealing temperatures. Complete linearity was achieved at 800° C. Higher temperatures were not tried, but linearity is expected to continue past 800° C. Annealing at 800° C. for two minutes allowed a slightly higher current flow compared to the one minute anneal at the same temperature. During the post-deposition annealing, the high work function metal layer diffuses through the oxide forming layer and getters surface oxides from the p-type Group III nitride. Thus, annealing temperature and duration must facilitate the diffusion through the oxide forming layer. The annealing temperature should not be high enough to allow appreciable nitrogen vacancies that could compensate the p-type doping in the p-type Group III nitride. At high temperatures nitrogen vacancies could form due to chemical reaction of Group III nitrides with the contacting metals or due to decomposition of Group III nitrides. The determination of whether a sufficient anneal has been conducted for any particular contact structure is best determined by examination of the composition of a sample contact, e.g., by a composition depth profile obtained using Auger Electron Spectroscopy.

Figure 3:
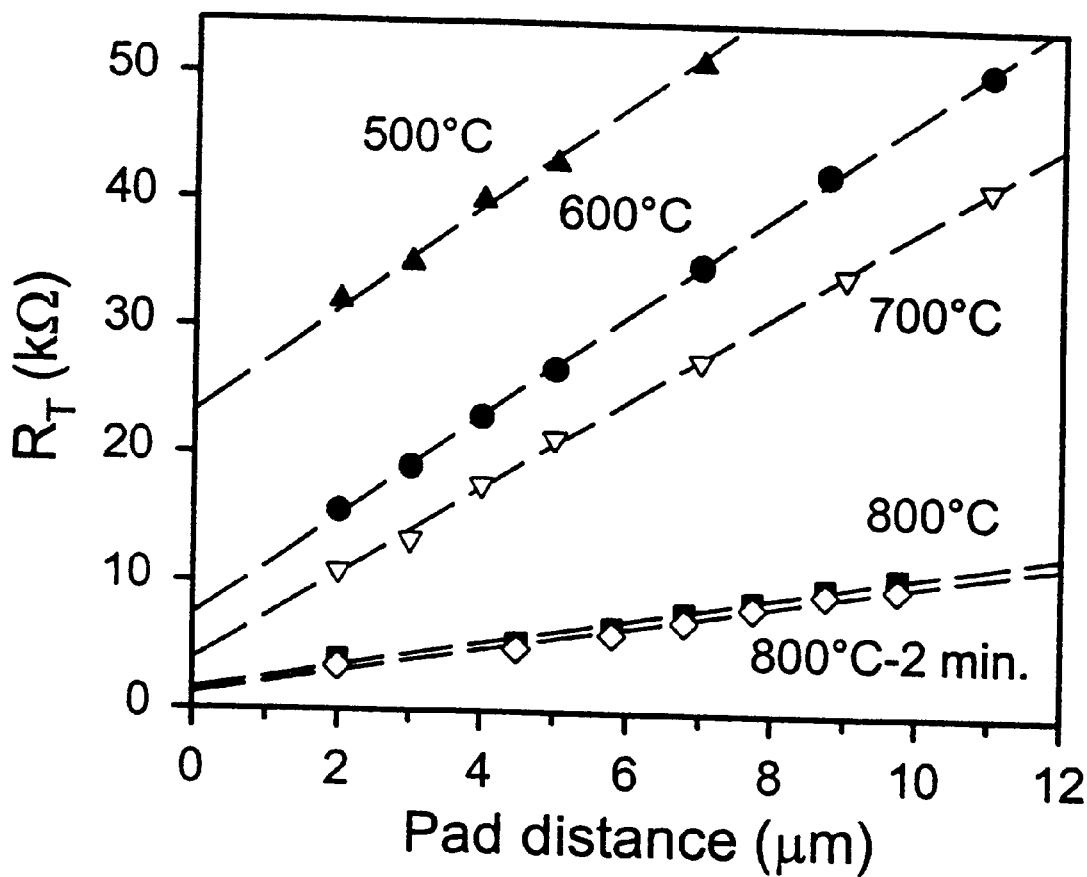
FIG. 3 plots total resistance $R_T$ versus pad spacing for experimental Ti/Pt/Au contacts formed in accordance with the invention.
Figure 4:
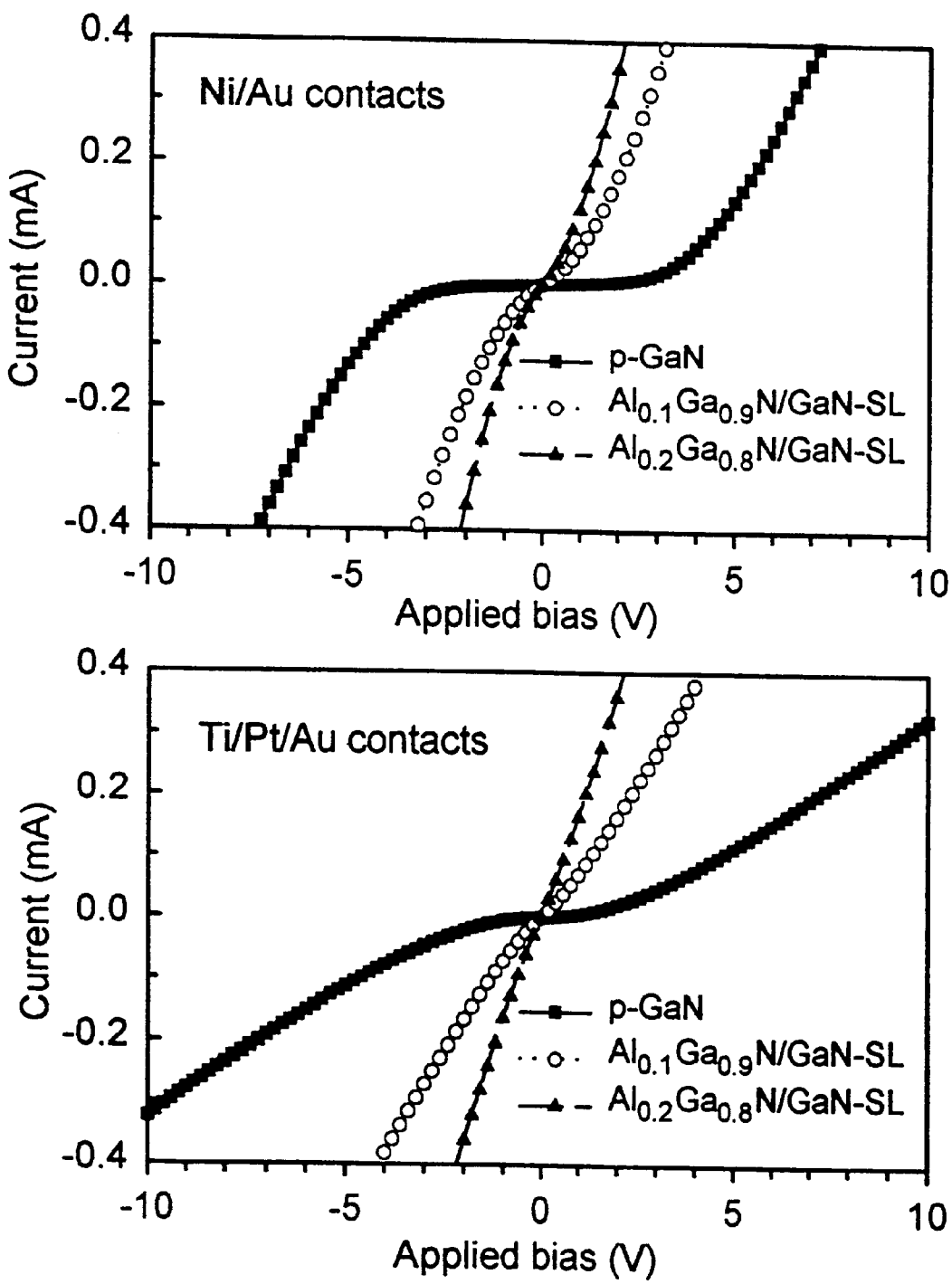
FIG. 4 illustrates I–V characteristics for Ti/Pt/Au contacts formed in accordance with the invention on different types of p-type Group III nitride layers.

FIG. 3 plots total resistance $R_T$ versus pad spacing for experimental Ti/Pt/Au contacts. The slope of $R_T$ versus pad spacing decreased slightly with increasing annealing temperature until 700° C., then abruptly decreased from 700° C. to 800° C. This reduction corresponds to a factor of three decrease in $R_C$. The lowest $R_C$ and $P_c$ realized in experimental Ti/Pt/Au contacts annealed at 800° C. for two minutes were respectively $4.2 \times 10^{-5}$ $\Omega$-cm$^2$ and 21 $\Omega$-mm. Ti/Pt/Au contacts were also successful on p-type III-nitride superlattices, as shown by the I–V curves in FIG. 4.

The low resistances obtained demonstrate that an oxide getter layer which is then consumed by a high work function layer improves contacts compared to conventional Pt or Pt/Au contacts reported by others. Other types of oxide getter materials and high work function material may be used. Ti, Pd, Cr or other oxide forming metals can serve as a getter layer, and then single or multiple layers of metallization elements are used for their metallurgical stability and high work function characteristics. A capping layer is preferred to inhibit oxidation of the high work function metal layer, but is not required for a functional contact. Exemplary contacts are Ti/Re/Au and Pd/Ti/Ni/Au.

While various embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A metallization method for forming a contact electrode on p-type Group III nitride materials, the method comprising steps of:

depositing an oxide forming layer on a surface of a p-type Group III nitride layer;

depositing a high work function metal on the oxide forming layer;

annealing at a temperature in the approximate range of between 700° C. and 800° C. to permit diffusion of the high work function metal through the oxide forming layer, and wherein said oxide forming layer comprises Ti.

2. The method of claim 1, wherein said high work function metal comprises Pt.

3. The method of claim 2, further comprising a step of depositing an Au cap layer on said high work function metal.

4. The method according to claim 1, wherein said high work function metal comprises Pd.

5. A metallization method for forming a contact electrode on p-type Group III nitride materials, the method comprising steps of:

depositing an oxide forming layer on a surface of a p-type Group III nitride layer;

depositing a high work function metal on the oxide forming layer;

annealing at a temperature in the approximate range of between 700° C. and 800° C. to permit diffusion of the high work function metal through the oxide forming layer;

wherein said oxide forming layer comprises Cr; and wherein said high work function metal is one of Pt and Pd.

6. The method according to claim 5, wherein said high work function metal comprises Pt.

7. A metallization method for forming a contact electrode on p-type Group III nitride materials, the method comprising steps of:

depositing a first layer from one of Ti, Cr, Pd, and Ni;

depositing a high work function metal on the first layer;

annealing at a temperature in the approximate range of between 700° C. and 800° C. to permit diffusion of the high work function metal through the first layer; and wherein said high function work metal is one of Pt and Pd.

8. The method according to claim 7, further comprising a step of depositing a metal cap layer on said high work function metal.

* * * * *

UNITED STATES PATENT AND TRADEMARK OFFICE
CERTIFICATE OF CORRECTION

PATENT NO. : 6,586,328 B1
DATED : July 1, 2003
INVENTOR(S) : Adesida et al.

It is certified that error appears in the above-identified patent and that said Letters Patent is hereby corrected as shown below:

<u>Title page,</u>
Item [56], References Cited, OTHER PUBLICATIONS, delete
"Suzuki et al. (Applied Physics Letters vol. 74, No. 2, Jan. 11, 1999. pp. 275-276)".
Item [57], ABSTRACT,
Line 5, delete "on".

<u>Column 3,</u>
Line 42, delete "$P_c$" and insert -- $\rho c$ -- therefore.

Signed and Sealed this

Twenty-fourth Day of February, 2004

JON W. DUDAS
*Acting Director of the United States Patent and Trademark Office*